(12) United States Patent
Hamasaki (10) Patent No.: US 6,564,743 B1
(45) Date of Patent: May 20, 2003

(54) METHOD FOR FORMING OXIDE FILM OF SEMICONDUCTOR DEVICE, AND OXIDE FILM FORMING APPARATUS CAPABLE OF SHORTENING PRE-PROCESSING TIME FOR CONCENTRATION MEASUREMENT

(75) Inventor: Kenichi Hamasaki, Kagoshima (JP)

(73) Assignee: Sony Corporation, Tokyo (JP)

(*) Notice: Subject to any disclaimer, the term of this patent is extended or adjusted under 35 U.S.C. 154(b) by 155 days.

(21) Appl. No.: 09/675,235

(22) Filed: Sep. 29, 2000

Related U.S. Application Data

(62) Division of application No. 08/862,359, filed on May 23, 1997, now Pat. No. 6,140,250.

(30) Foreign Application Priority Data

May 27, 1996 (JP) ............................................. 8-132376

(51) Int. Cl.$^7$ ........................... H01L 21/00; C23C 16/00
(52) U.S. Cl. ................................................. 118/723 E
(58) Field of Search ..................... 118/723 E, 723 R; 156/345.47, 345.44, 345.43

(56) References Cited

U.S. PATENT DOCUMENTS 4,920,917 A * 5/1990 Nakatani et al. ............ 118/718
5,494,522 A * 2/1996 Moriya et al. ........... 118/723 E

* cited by examiner

Primary Examiner—Thi Dang
(74) Attorney, Agent, or Firm—Sonnenschein, Nath & Rosenthal

(57) ABSTRACT

In an oxide film forming apparatus for a semiconductor device preprocessing time to measure concentration can be greatly shortened, and the oxide film can be formed with supreme reproducibility in stable manufacturing stages. The oxide film forming apparatus is arranged by comprising: a high voltage source for generating a DC high voltage having a negative polarity; one pair of electrodes arranged apart from each other via a space portion, the DC high voltage being applied to one electrode of the one-paired electrodes; a flow path channel formed from an upstream located in a direction perpendicular to the electrodes via the space portion to a downstream, through which oxygen gas may flow; an oxygen source for supplying the oxygen gas from the upstream side of the flow path channel; and a substrate base arranged on the downstream side of the flow path channel, by which a semiconductor substrate can be mounted at a position where this semiconductor substrate is exposed by the oxygen gas which has passed between the one pair of electrodes.

23 Claims, 10 Drawing Sheets

| 1397 | Prior art | Present Invention |
|---|---|---|
| 1st | 1.370 | 1.371 |
| 2nd | 1.371 | 1.367 |
| 3rd | 1.368 | 1.368 |
| AVE | 1.370 | 1.369 |
| R | 0.003 | 0.004 |

| 131-3 | Prior art | Present Invention |
|---|---|---|
| 1st | 2.889 | 2.883 |
| 2nd | 2.894 | 2.878 |
| 3rd | 2.896 | 2.880 |
| AVE | 2.893 | 2.880 |
| R | 0.007 | 0.005 |

| 1397 | Prior art | Present Invention |
|---|---|---|
| 1st | 1.368 | 1.374 |
| 2nd | 1.372 | 1.370 |
| 3rd | 1.372 | 1.370 |
| AVE | 1.371 | 1.371 |
| R | 0.004 | 0.004 |

| 125-R1 | Prior art | Present Invention |
|---|---|---|
| 1st | 4.394 | 4.401 |
| 2nd | 4.380 | 4.392 |
| 3rd | 4.383 | 4.393 |
| AVE | 4.386 | 4.395 |
| R | 0.014 | 0.009 |

| 131-3 | Prior art | Present Invention |
|---|---|---|
| 1st | 2.861 | 2.871 |
| 2nd | 2.856 | 2.863 |
| 3rd | 2.862 | 2.864 |
| AVE | 2.860 | 2.866 |
| R | 0.006 | 0.008 |

| 125-R1 | Prior art | Present Invention |
|---|---|---|
| 1st | 4.384 | 4.390 |
| 2nd | 4.377 | 4.384 |
| 3rd | 4.373 | 4.382 |
| AVE | 4.387 | 4.385 |
| R | 0.011 | 0.008 |

| 131-3 | First time |
|---|---|
| 1st | 2.937 |
| 2nd | 2.937 |
| 3rd | 2.937 |
| AVE | 2.937 |
| R | 0.000 |

| 131-3 | Second time |
|---|---|
| 1st | 2.932 |
| 2nd | 2.937 |
| 3rd | 2.937 |
| AVE | 2.935 |
| R | 0.005 |

| 131-3 | Sixth time |
|---|---|
| 1st | 2.948 |
| 2nd | 2.945 |
| 3rd | 2.944 |
| AVE | 2.946 |
| R | 0.004 |

| 131-3 | Seventh time |
|---|---|
| 1st | 2.944 |
| 2nd | 2.942 |
| 3rd | 2.943 |
| AVE | 2.943 |
| R | 0.002 |

| 131-3 | Eleventh time |
|---|---|
| 1st | 2.912 |
| 2nd | 2.910 |
| 3rd | 2.910 |
| AVE | 2.911 |
| R | 0.002 |

| 131-3 | Twelfth time |
|---|---|
| 1st | 2.906 |
| 2nd | 2.909 |
| 3rd | 2.908 |
| AVE | 2.908 |
| R | 0.003 |

| 131-3 | Nineteenth time |
|---|---|
| 1st | 2.870 |
| 2nd | 2.869 |
| 3rd | 2.869 |
| AVE | 2.869 |
| R | 0.001 |

| 131-3 | Twentieth time |
|---|---|
| 1st | 2.870 |
| 2nd | 2.870 |
| 3rd | 2.868 |
| AVE | 2.869 |
| R | 0.002 |

METHOD FOR FORMING OXIDE FILM OF SEMICONDUCTOR DEVICE, AND OXIDE FILM FORMING APPARATUS CAPABLE OF SHORTENING PRE-PROCESSING TIME FOR CONCENTRATION MEASUREMENT

RELATED APPLICATION DATA

This application is a divisional of application Ser. No. 08/862,359 filed May 23, 1997, now U.S. Pat. No. 6,140, 250. The present and foregoing applications claim priority to Japanese application No. P08-132376 filed May 27, 1996. All of the foregoing applications are incorporated herein by reference to the extent permitted by law.

BACKGROUND OF THE INVENTION

The present invention generally relates to a method for forming an oxide film of a semiconductor device, and an oxide film forming apparatus. More specifically, the present invention is directed to an oxide film forming method for a semiconductor device, capable of shortening pre-processing time for concentration measurements, and also to an oxide film forming apparatus.

In stages for manufacturing variable capacitors and the like, a silicon epitaxial layer corresponding to a thin silicon monocrystal layer is grown on a silicon substrate and a plurality of silicon epitaxial layers are stacked. In such a silicon epitaxial layer, a film thickness and a film quality constitute very important factors. Conventionally, such a characteristic check is carried out by measuring impurity concentration.

An impurity concentration measurement of epitaxial layer is performed by forming an oxide film on a surface. When mercury of a mercury probe of a measuring apparatus is made in contact with the formed oxide film, the oxide film forms a depletion layer, so that a Shottky barrier diode is produced. The characteristic value of this Shottky barrier diode is measured so as to measure the impurity concentration of the epitaxial layer.

As a result, it is required to form the oxide film as the pre-process operation for the impurity concentration measurement of the epitaxial layer. In the principle of this concentration measurement, the film thickness of this oxide film must be selected to be at least 15 angstrom, preferably approximately 20 angstrom.

Conventionally, as the method for forming the oxide film on a wafer, the wafer is boiled within a hydrogen peroxide water solution. The maximum film thickness of the oxide film formed by this conventional boiling method is limited to approximately 10 angstrom. It is practically difficult to form such a film thickness thicker than about 10 angstrom.

Therefore, in addition to the above-described manufacturing stage, the resultant oxide film is blown by nitrogen gas for approximately 1.5 hours, so that approximately 5 angstrom may be additionally formed on the above-described oxide film. However, there is a problem that usually 2 hours, approximately 3 hours in maximum are required as the time required to form such an oxide film having a total thickness of about 15 angstrom in addition to the film thickness of 10 angstrom by way of the hydrogen peroxide water solution boiling process. There are further problems that there is a lack of stability in the oxide film forming stage, and the reproducibility thereof is deteriorated. Moreover, since an overall film thickness is limited to on the order of 15 angstrom, there is another problem that it is practically difficult to form a film thickness thicker than 15 angstrom. As a consequence, this conventional oxide film forming method is not proper.

Furthermore, according to the thermal oxidation method in which a wafer is oxidized in high temperatures in the diffusion furnace, when the oxide film to be formed becomes the thin film, there is another problem that the uniformity of the thin film is deteriorated due to the air entrainment. In addition, as to the film thickness, a desirable range is not always obtained.

Under such a circumstance, the oxide film forming method and the oxide film forming apparatus by way of the gas discharge have been developed. As such conventional oxide film forming method and oxide film forming apparatus, for instance, the oxidation effects of ozone generated by the discharge are utilized (disclosed in, for example, Japanese Laid-open Patent Application No.4-39931 opened in 1992, or No.7-033405 opened in 1995).

These conventional techniques have introduced the principle structure such that the AC high voltage is applied to the electrodes provided in the gas so as to produce the gas discharge. Thus, ozone is finally generated.

In other words, when the AC high voltage applied to the electrodes provided in the gas is increased to produce the strong electric field, the generations of the electron avalanche are rapidly increased, and the electrolytic dissociation, or ionization is temporarily interrupted due to the shield effect by the space charges. Soon the electron avalanche is again generated. Thus, it is broughted into a small intermittent discharge, i.e., a corona discharge state. A large amount of ozone is generated by such a corona discharge, or the silent discharge such that the occurrence of corona is suppressed by providing the insulating material on the electrode surface. Thereafter, the silicon wafer is oxidized by utilizing the oxidation effect of this ozone to thereby form the oxide film.

On the other hand, when the supply of AC power is increased to further increase the strength of the electric field from the above-described condition that the corona discharge, or the silent discharge is generated, the discharge region is limited to the specific portion of the electrode surface, and also the emission strength is increased, so that the corona, or silent discharge is transferred to the arc discharge. As a result, the supplied power is consumed so as to heat the electrodes, so that this supplied power never contributes the generation of ozone.

Accordingly, the oxide film forming operation conditions by way of the ozone oxidation are set within the range defined from such conditions that the generation of the corona discharge, or the silent discharge is commenced up to such conditions that the corona or silent discharge is transferred to the arc discharge in the above-mentioned conventional structure by using the ozone oxidation effects.

However, it is difficult to form the silicon oxide film having the film thickness thicker than, or equal to 15 angstrom by the above-explained conventional structure by using the oxidation effects of ozone produced from the corona discharge, or the silent discharge. Moreover, there is a drawback that the time required for forming a predetermined thickness of the silicon oxide film becomes very long.

In addition, this conventional structure owns such problems that the stability of the oxide film forming process is low, and the reproducibility of forming such an oxide film is deteriorated.

SUMMARY OF THE INVENTION

The present invention has been made to solve the above-described various problems and drawbacks involved in the conventional techniques, and therefore, has an object to provide an oxide film forming method of a semiconductor device, and an oxide film forming apparatus, capable of shortening pre-process time for a concentration measurement, and furthermore capable of achieving supreme reproducibility of forming an oxide film, while stabilizing a forming step.

Before describing the inventive ideas, the Inventors, or Applicants have considered the mechanism of oxide film forming stages on a surface of a silicon wafer. The following interpretation is so far established. That is, a formation of an oxide film is not progressed in such a way that silicon atoms of a silicon substrate are moved through the previously formed silicon oxide film to the surface of the silicon oxide film. But, the formation of the oxide film is progressed in such a manner that oxygen is diffused into the previously formed silicon oxide film in accordance with the temperature gradients, and then reacts with a surface (boundary) between silicon and silicon oxide (Si—$SiO_2$ surface). In this case, Si may be predicted such that at the Si—$SiO_2$ surface, Si is under excessive state in view of stoichiometry.

On the other hand, resistivity of monocrystal silicon oxide (crystal) is $10^{22}$ Ωcm, namely a high resistivity value, whereas resistivity of the silicon oxide film formed on the wafer is only about $10^{16}$ Ωcm. This implies that both the coupling degree and the close-packing degree of the silicon oxide film formed on the wafer are relatively low, and spaces through which atoms can easily pass are present.

As a consequence, it may be considered in the conventional structure with employment of ozone as follows. That is, ozone sequentially passes through the spaces contained in this oxide film and may reach the boundary surface. At the boundary surface, the ozone is decomposed to thereby produce oxygen molecule and oxygen in the generation period. This oxygen in the generation period may oxidize silicon of the boundary surface, so that it becomes a silicon oxide film ($SiO_2$). This newly formed silicon oxide film is added to increase the thickness of the silicon oxide film. As a result, the boundary surface is gradually moved inside the wafer along the wafer internal direction in conjunction with the increase of the thickness of the silicon oxide film.

On the other hand, since ozone owns a large dimension in view of micrometer, the spaces through which the ozone should pass become deep (otherwise, hierarchies of spaces are increased) in connection with increasing of the silicon oxide film thickness. Then, the ozone can readily pass through the spaces. In other words, it is conceivable that the resistance when the ozone is diffused into the silicon oxide film (film diffusion resistance) is increased in accordance with increasing of the film thickness, and therefore the diffusion of this ozone is blocked, so that the ozone does not reach the boundary surface, and thus the thickness of the formed film is limited (for example, limitation in on the order of 15 angstrom).

Otherwise, originally, the oxygen molecule generated from the ozone in the boundary surface is again diffused up to the surface of the oxide film and then is emitted from the film. However, while the above-described boundary film diffusion resistance is increased, the emission of the oxygen molecule is also decreased. As a consequence, the oxygen molecule will remain near the boundary surface and in the oxide film, so that partial pressure is increased, and the diffusion of this ozone from the boundary film surface to the boundary surface is blocked by this partial pressure. As a consequence, there is a limitation in the thickness of the formed film.

Then, the Inventors have paid their attentions to oxygen ions (monoatomic negative ions, or diatomic negative ions) instead of the ozone (oxygen in generation period being used as oxidation agent) in the prior art as to the optimum mode of the oxygen atoms or the oxygen molecule, which may react with silicon.

In other words, since the dimension of the oxygen ion is smaller than that of the ozone in view of micrometer, even when the film thickness becomes deep, the film diffusion resistance is not increased. As a consequence, the oxygen ions can be easily moved in the oxide film gradient and then can reach the Si—$SiO_2$ boundary surface. Among these oxygen ions, for instance, the monoatomic oxygen ions deprive electrons from silicon at the boundary surface to cause it as silicon of positive charges, and also the monoatomic oxygen ions per se become diatomic negative ions. Then, the diatomic negative ions react with this silicon of positive charges to thereby form the silicon oxide film. As a consequence, it is conceivable that the oxide film forming method by way of the ion reaction is suitable.

Furthermore, it is conceivable that an oxide film forming apparatus capable of readily and mainly generating oxygen ions rather than generating ozone, is preferable.

To achieve the above-described object, an oxide film forming method of a semiconductor device, according to the present invention, is featured by that oxygen ions are made in contact with a surface of a semiconductor substrate to thereby form a thin oxide film on the surface of the semiconductor substrate.

According to this method, since the diffusion resistance related to the oxygen ions is low, the diffusion of the oxygen ions to the boundary surface can be easily made, so that the thickness of the formed film can be increased.

In particular, when the oxide film forming method is realized such that the above-described the oxygen ions are produced by conducting oxygen gas into an electric field generated in response to a DC high voltage having a negative polarity and then by ionizing the conducted oxygen gas, the oxygen gas is ionized without producing ozone.

In addition, when the oxide film forming method is realized such that the above-described the oxygen ions are produced by causing oxygen gas to impinge on an electrode to which a DC high voltage having a negative polarity is applied and then by ionizing the impinging oxygen gas, the oxygen gas can be effectively ionized.

Also to achieve the above-described object, an oxide film forming apparatus of a semiconductor device, according to the present invention, is featured by comprising: a high voltage source for generating a DC high voltage having a negative polarity; one pair of electrodes arranged apart from each other via a space portion, the DC high voltage being applied to one electrode of the one-paired electrodes; a flow path channel formed from an upstream located in a direction perpendicular to the electrodes via the space portion to a downstream, through which oxygen gas may flow; an oxygen source for supplying the oxygen gas from the upstream side of the flow path channel; and a substrate base arranged on the downstream side of the flow path channel, by which a semiconductor substrate can be mounted at a position where this semiconductor substrate is exposed by the oxygen gas which has passed between the one pair of electrodes.

In accordance with the oxide film forming apparatus with employment of the above-described arrangement, a strong electric field is produced between one pair of electrodes in which the DC high voltage having the negative polarity generated from the high voltage source is applied to one of these electrodes. At such a stage that the oxygen gas supplied from the oxygen source will flow from the upstream of the flow path channel to the downstream thereof, for instance, when the electrons which have been produced by the electron avalanche and then have been accelerated by the electric field impinge the oxygen gas, the oxygen ions are produced. The flow path channel intersects this electric field and is provided between the electrodes. Then, the semiconductor substrate mounted on the substrate base arranged in the downstream of the flow path channel is exposed by the oxygen ions, so that the oxide film is formed on the surface of the semiconductor substrate due to ion reaction.

Moreover, when this oxide film forming apparatus is arranged by that at least the one pair of electrodes, the flow path channel, and the substrate base are stored into a chamber, coupling between the oxygen ions and the molecule contained in air is suppressed, so that the oxygen ions can be effectively made in contact with the semiconductor substrate.

Also, when the oxide film forming apparatus is arranged by that the above-described the chamber is made of a closed structure, and pressure in the chamber is increased higher than, or equal to atmospheric pressure, both the oxygen pressure and the oxygen ion pressure within the chamber are increased. Accordingly, the ionization of the oxygen gas and the ion reaction by the oxygen ions can be advanced.

Otherwise, when the oxide film forming apparatus is arranged by that the above-described the chamber is made of a closed structure, and pressure in the chamber is decreased lower than, or equal to atmospheric pressure, the molecule contained in air within the chamber is decreased. As a result, there is a little chance of molecule entrainment, and thus the film quality of the oxide film can be improved.

BRIEF DESCRIPTION OF THE DRAWINGS

For a better understanding of the present invention, reference is made of a detailed description to be read in conjunction with the accompanying drawings in which.

DETAILED DESCRIPTION OF THE PREFERRED EMBODIMENTS

Referring now to drawings, various embodiments of the present invention will be described.

Figure 1:
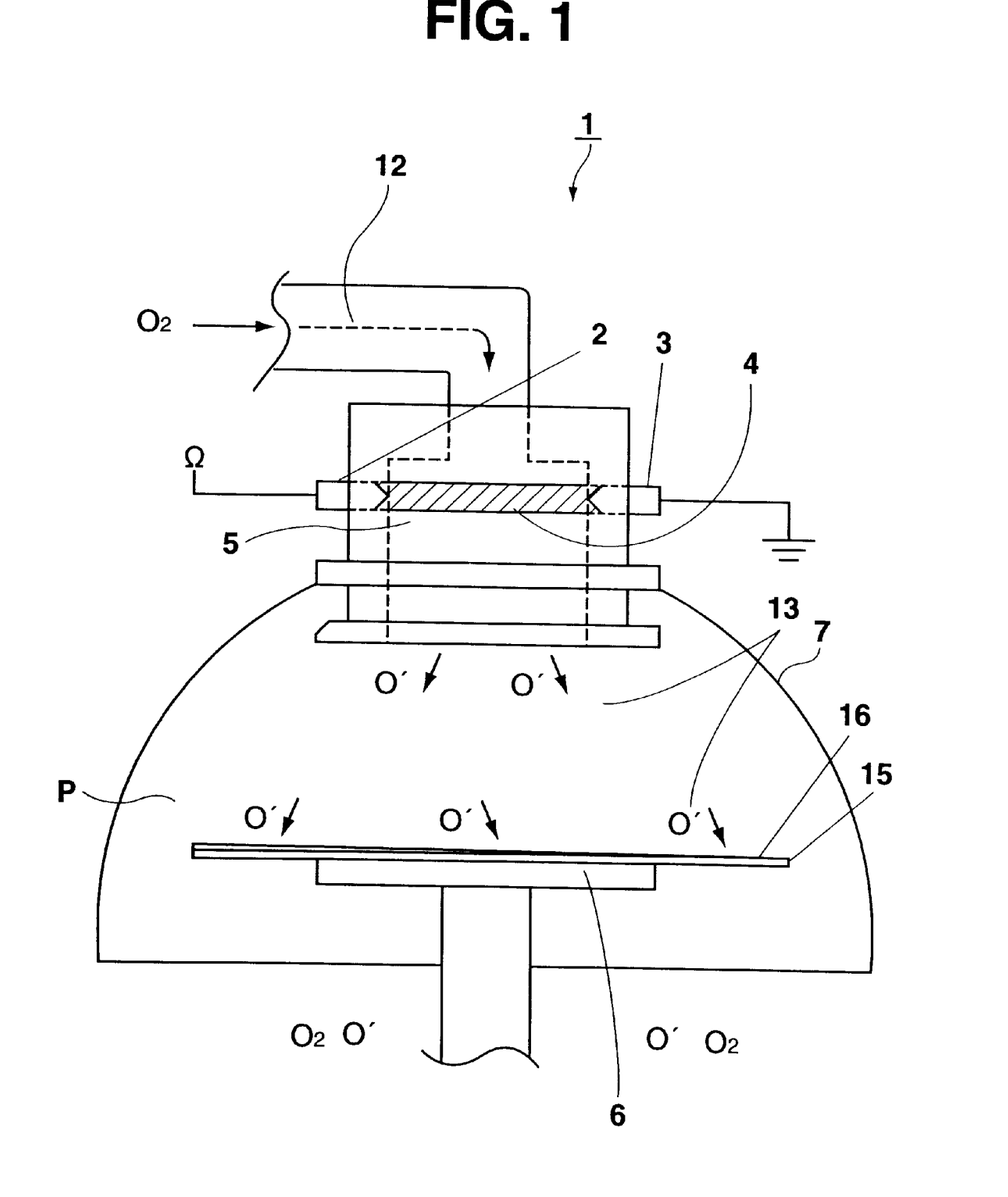
FIG. 1 is a sectional view for schematically representing an oxide film forming apparatus of a semiconductor device, according to an embodiment of the present invention.

FIG. 1 is a sectional view for schematically representing an oxide film forming apparatus of a semiconductor device, according to an embodiment mode of the present invention.

As indicated in FIG. 1, in an oxide film forming apparatus 1 of a semiconductor device, according to the embodiment of the present invention, one pair of electrodes 2 and 3 are arranged with keeping a space portion 4 at an upper portion of a chamber 7. This chamber 7 is formed in a semi-spherical shape, and an internal pressure "P" thereof is set to atmospheric pressure. To one electrode 2, a DC high voltage "V" having a negative polarity is applied from a high voltage source which may generate a DC high voltage having a negative polarity. The other electrode 3 is grounded. As a result, an electric field having a potential gradient is produced along a direction for coupling these electrodes within the space portion 4 between the electrodes 2 and 3.

Furthermore, a flow path channel 5 is formed from an upper stream of a direction perpendicular to the electrodes 2 and 3 via the space portion 4 toward a downstream. An oxygen gas 12 is supplied from an oxygen source from the upstream side of this flow path channel 5. Preferably, a flow rate of the oxygen gas 12 is selected to be on the order of 4 to 5 l/m. The oxygen gas 12 will flow via the space portion 4 to the downstream side. A substrate base 6 is arranged on the downstream side of the flow path channel 5, on which a semiconductor substrate 15 may be mounted.

Then, these one-paired electrodes 2 and 3, flow paths channel 5, and substrate base 6 are stored into the chamber 7.

Preferably, it is desirable that the substrate base 6 is located in such a manner that a distance defined from either the electrodes 2 and 3 or the space portion 4 to the semiconductor substrate 15 is equal to the distance between one-paired electrodes 2 and 3, otherwise becomes 15 to 20 times longer than the dimension of the space portion 4.

Figure 2:
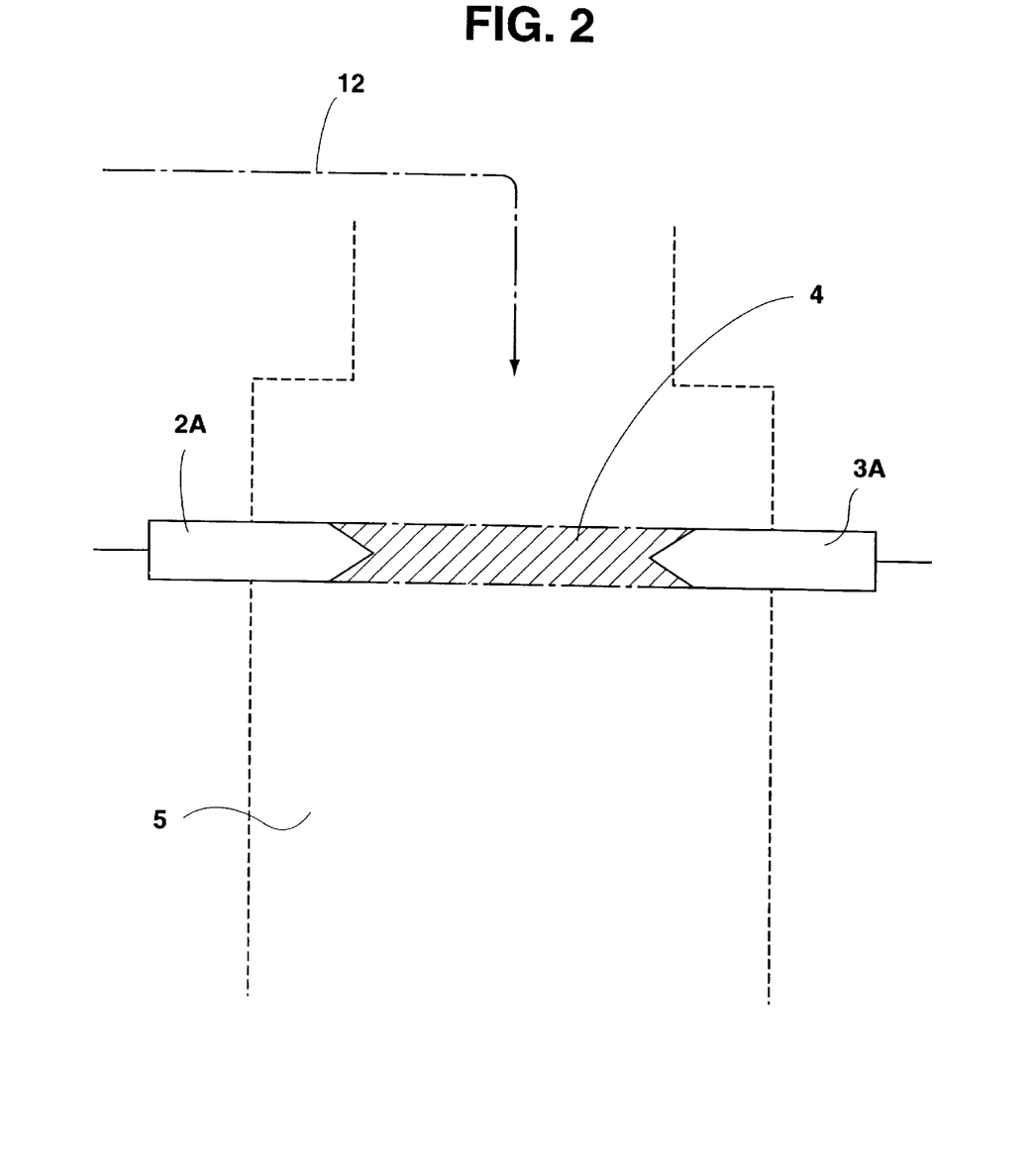
FIG. 2 is an explanatory diagram for schematically explaining an arrangement such that a tip portion of an electrode is projected into a flow path channel.

As indicated in FIG. 1, the structures of the electrodes 2 and 3 may be made in such a way that these electrodes 2 and 3 are not projected in the flow path channel 5. Alternatively, as indicated in FIG. 2, it is also possible to employ such a structure that tip portions of electrodes 2A and 3A are projected into the flow path channel 5.

Figure 3:
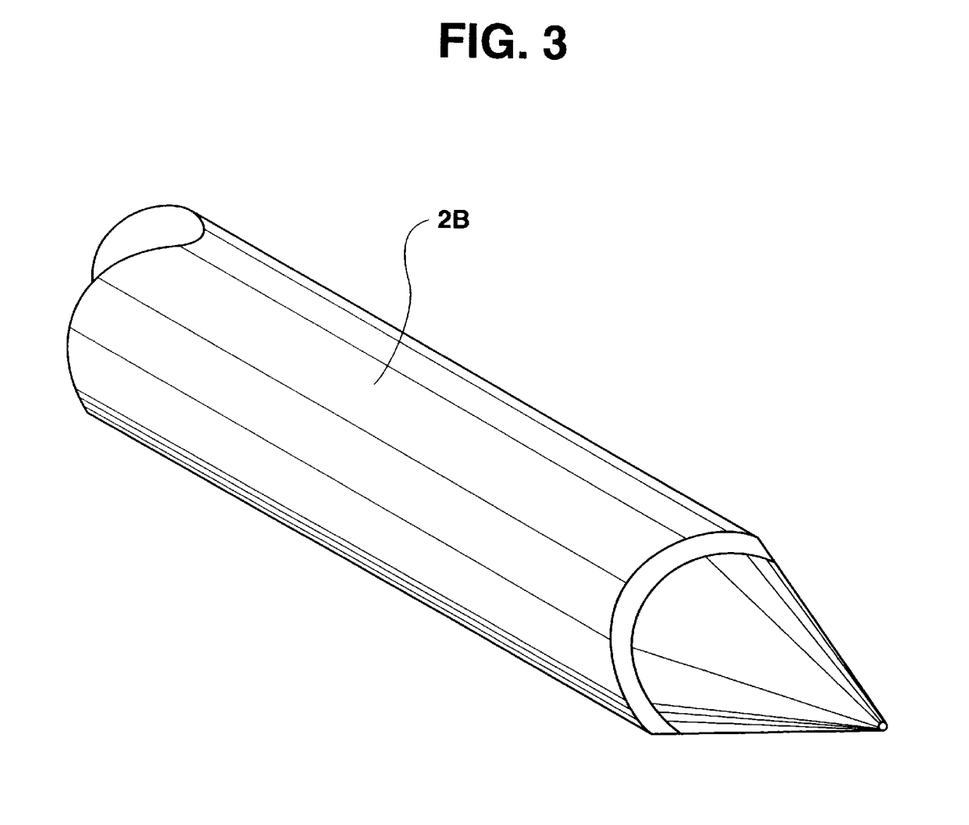
FIG. 3 is a perspective view for indicating an electrode of an embodiment applied to the oxide film forming apparatus of the semiconductor device, according to the present invention.
Figure 4:
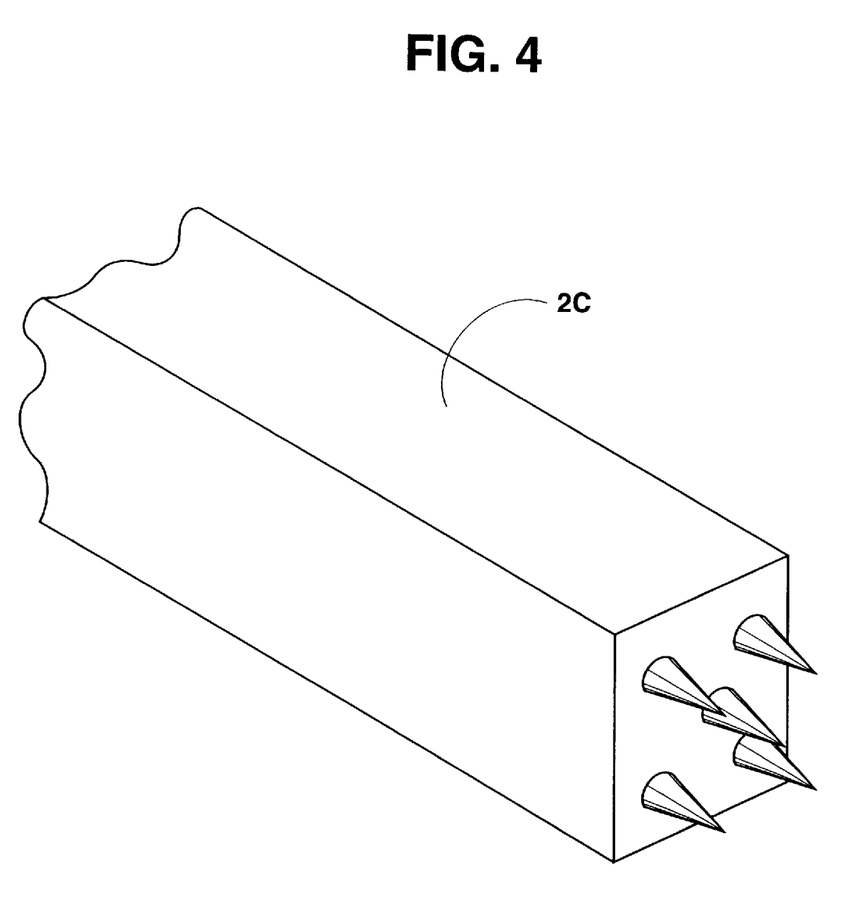
FIG. 4 is a perspective view for indicating an electrode of another embodiment applied to the oxide film forming apparatus of the semiconductor device, according to the present invention.
Figure 5:
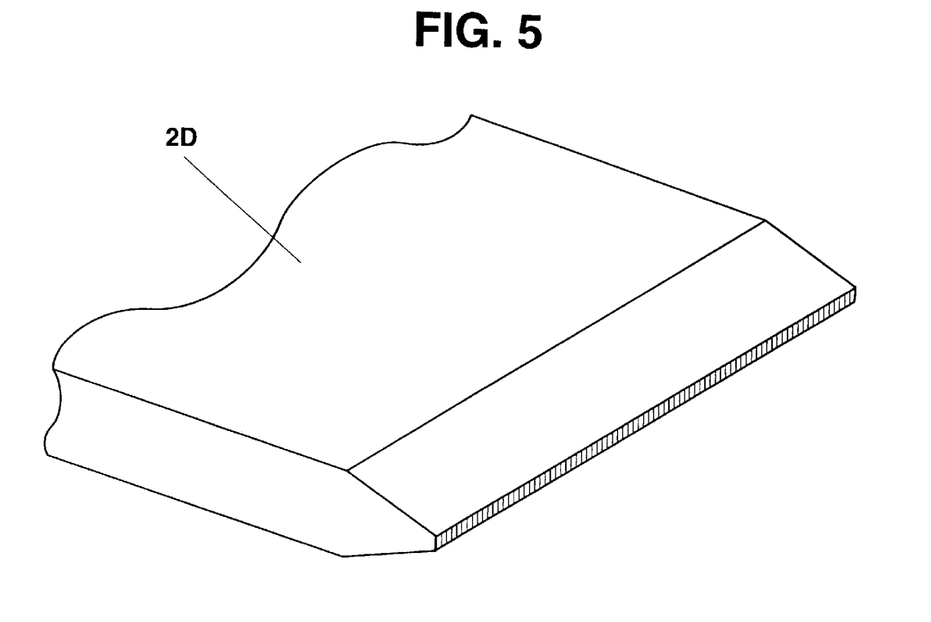
FIG. 5 is a perspective view for indicating an electrode of a further embodiment applied to the oxide film forming apparatus of the semiconductor device, according to the present invention.

Other desirable electrode shapes may be conceived. As indicated in a perspective view of FIG. 3, an electrode 2B has a sharpened tip portion. Also, as shown in FIG. 4, an electrode 2C owns a tip portion in which a plurality of peak portions are provided. As indicated in FIG. 5, a plate-shaped electrode 2D has a tip portion which constitutes a flat portion of a small area.

In the arranged shown in FIG. 1, the pressure "P" inside the chamber 7 is selected to be 1 atm, since the lower end thereof is opened under atmospheric pressure.

Alternatively, the chamber may be constructed of a closed structure to which pressure may be applied. For instance, under pressure application condition (upper limit value is approximately 5 atm), the oxygen ionization and the oxide film forming process may be progressed.

Conversely, the chamber may be made as a closed structure whose pressure may be reduced. For example, under pressure reduction condition (lower limit value is approximately 0.1 atm), the oxygen ionization and the oxide film forming process is progressed.

Subsequently, operations of this oxide film forming apparatus will now be described.

First, a semiconductor substrate 15 on which an oxide film 16 should be formed is mounted on the substrate base 6. As a result, the semiconductor substrate 15 is located on such a position that this semiconductor substrate 15 is exposed by oxygen ions 13 which have passed through the space portion 4.

Furthermore, oxygen gas 12 is supplied through the flow path channel 5 to the electrodes 2 and 3 along the right angle direction, so that the oxygen gas 12 passes through the space portion 4.

Next, when the negative voltage applied to the electrode 2 is further lowered, the current is increased. This is because electrons generated by the electrolytic dissociation, or ionization are accelerated by the electric field, kinetic energy is sufficiently applied to the electrons which impinge with other molecules, and these molecules are ionized. Every time one molecule is ionized, one electron is produced and then the electrons are increased. These electrons successively impinge with each other to be ionized, so that a large number of new electrons and of ions are produced, and a so-called "electron avalanche" will occur.

The ions which are generated in the above-described manner will impinge with gas molecule to thereby produce electrons. If the strength of the electric field is sufficiently high, then these electrons are accelerated by this electric field and the accelerated electrons will impinge with other molecules which are ionized to produce electrons, so that another electron avalanche will occur. As described above, it is conceivable that the electrons having high energy among a large number of electrons which are mainly generated by the electron avalanche are consumed to reconstruct/maintain the electron avalanche, whereas other electrons having relatively low energy are attached to oxygen molecules to thereby become either negative monoatomic oxygen ions, or negative diatomic oxygen ions.

In this case, when the strength of the electric field is lower than, or equal to a predetermined strength, namely when the negative high voltage is higher than a preselected voltage (namely, this negative high voltage is shifted to a positive voltage side), no energy required for the ionization is supplied, so that the reaction is not progressed.

On the other hand, when the strength of the electric field is higher than a predetermined strength, namely when the negative high voltage is lower than a preselected voltage (namely, this negative high voltage is further shifted to the negative voltage side), the more energy than that required for the ionization is supplied. As a result, the occurrences of the electron avalanche are rapidly increased. As previously explained in the prior art, corona discharge and silent discharge may occur to thereby produce ozone, resulting in an unfavorable condition.

To avoid such a problem, according to this embodiment mode, the oxide film forming apparatus is arranged in such a manner that the operation conditions are mainly set within the range started from such a condition under which the useful electron avalanche is commenced, and ended before the corona discharge and the silent discharge will occur. In other words, the negative DC high voltage V is controlled so as to set the electric field in the proper strength range. As a consequence, it is possible to realize such a condition that the oxygen ions are produced in a high efficiency.

It should be noted that the negative DC high voltage available in the oxide film forming apparatus according to the present invention is selected to a range from −3 KV to −15 KV.

Also, a preferable range of the negative DC high voltage is selected from −5 KV to −12 KV.

Furthermore, the most preferable negative DC high voltage is selected from −8 KV to −10 KV.

The current value is preferably selected to be on the order of 0.1 to 20 mA.

In such an operation range, the oxygen gas 12 is ionized by the collision of the accelerated electrons based on the electron avalanche produced by the electric field formed in the space portion 4, so that the ionized oxygen gas 12 mainly becomes negative monoatomic oxygen ions 13. The negative monoatomic oxygen ions 13 are moved downwardly within the chamber 7, and thereafter are made in contact with the semiconductor substrate (wafer) 15 positioned apart form the electrodes 2 and 3 by a preselected distance. Since the oxygen ions 13 have the high coupling characteristic, these oxygen ions 13 are coupled with silicon on the semiconductor substrate 15, so that an oxide silicon film ($SiO_2$) 16 is formed.

On the other hand, as shown in FIG. 2, when the electrodes 2A and 3A are projected into the space portion 4, the oxygen gas which directly impinges with the electrode 2A among the oxygen gas 12 obtains the energy on the surface of the electrode to be ionized. There are certain possibilities that ozone is produced, because the ionization by the oxygen gas contact to this electrode 2A is carried out in a high efficiency, and high energy is directly exerted. Therefore, the operation conditions capable of suppressing the production of ozone and also capable of emphasizing the production of the oxygen ions must be optimized.

The coupling characteristic of the oxygen ions 13 is increased while these oxygen ions 13 are separated from the electrodes 2 and 3. As a consequence, the oxide film forming apparatus of the present invention is preferably constructed in such a way that, as previously explained, the substrate base 6 is set in such a manner that the distance defined from the electrodes 2, 3 or the space portion 4 to the semiconductor substrate 15 becomes a predetermined distance. Accordingly, the semiconductor substrate 15 is positioned in the oxygen ion 13, the coupling characteristic of which becomes high.

The chamber 7 corresponds to an isolation means for suppressing that the oxygen gas 12 and the oxygen ions 13 are coupled with the molecules contained in air and the substance existing around the oxygen gas or ions in order that the oxygen ions 13 are concentrated to the semiconductor substrate 15. This isolating means may establish better environments to form a thick film.

In the structure for closing the chamber 7, in which the pressure P within the chamber 7 is increased higher than, or equal to the atmospheric pressure, the pressure of the oxygen gas contained in the chamber 7 is increased in connection with increasing of the pressure, so that the ionization of the oxygen gas 12 is progressed. Furthermore, when the pressure of the oxygen ions is increased, the oxide film forming reaction by the oxygen ion 13 is progressed.

In such a structure case that the pressure P in the chamber 7 of the closed structure is reduced lower than, or equal to the atmospheric pressure, the molecule of the air contained in the chamber 7 is reduced. As a result, such a molecule entrainment chance is decreased over the oxide film to be formed. As a result, the film quality of the oxide film 16 can be improved.

Figure 6:
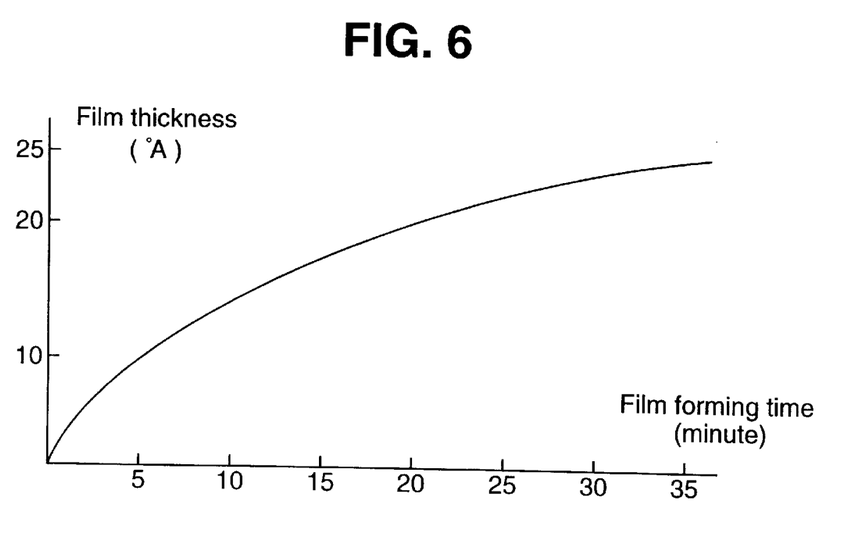
FIG. 6 is a graphic representation for showing an example of a film forming speed of the oxide film forming apparatus according to the present invention.

As to the film forming speed of the oxide film forming apparatus according to the present invention, as indicated in FIG. 6, a film thickness of 10 angstrom is obtained within 5 minutes after the film forming operation is commenced, and then a film thickness of 15 angstrom is obtained within 13 minutes after the film forming operation is commenced. This film forming time can be drastically shortened by approximately ⅑, as compared with the conventional film forming time by way of the hydrogen peroxide water solution boiling process and the nitrogen gas blowing process, namely 2 hours are required to form the film thickness of 15 angstrom.

Furthermore, the thicker films than 25 angstrom could be formed within such short time as about 35 minutes, which could not be realized in the prior art. Also, this film thickness may be arbitrarily realized by selecting the process time. It should be understood that as the time required to form the oxide film used in the measurement of the epitaxial layer impurity concentration during the manufacturing field, for example, 15 minutes or more are practically available.

Next, a description will now be made of measurement results and evaluations thereof when the oxide film formed by the oxide film forming apparatus according to the present invention is measured by the concentration measuring device.

Figure 7:
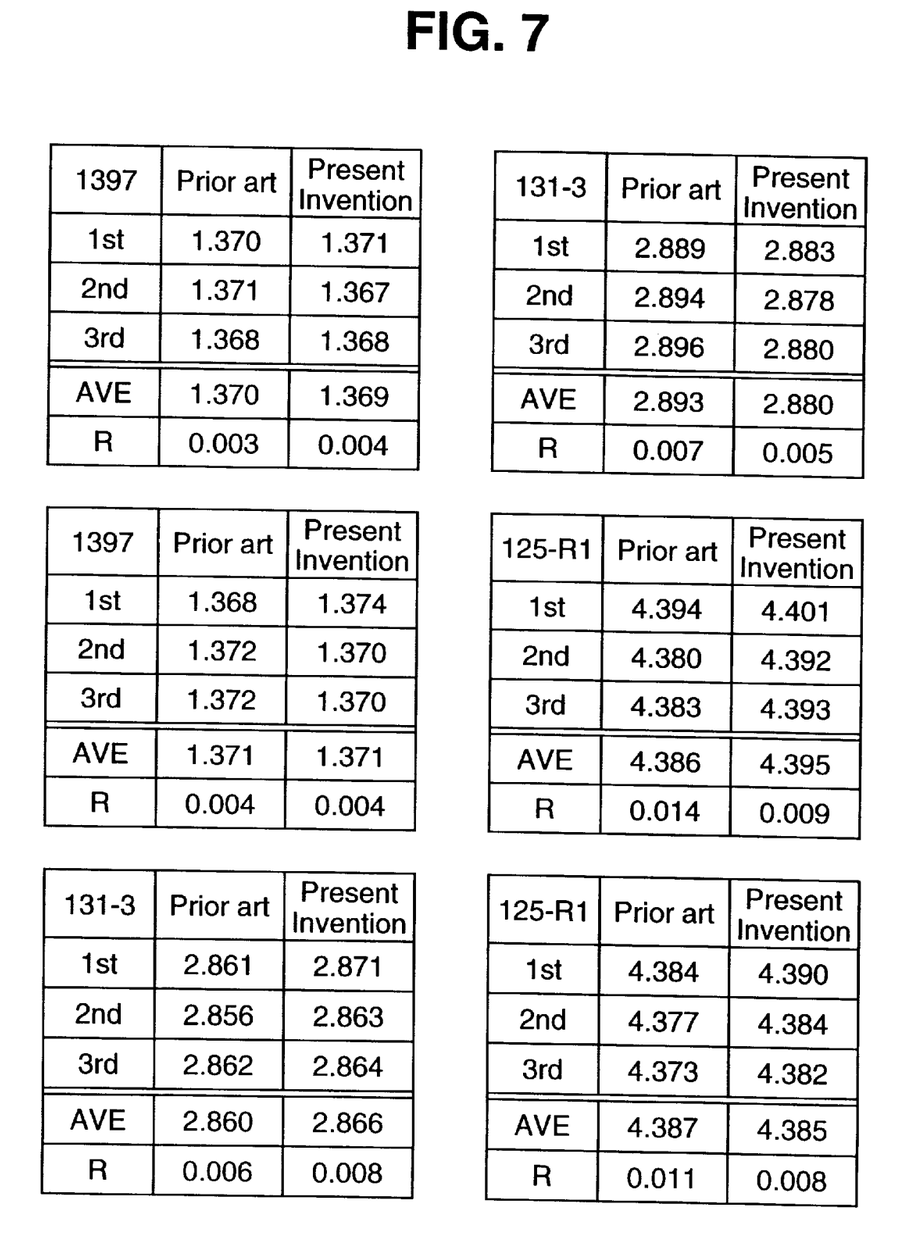
FIG. 7 shows a comparison diagram for listing results of concentration measurements for the oxide film formed by the oxide film forming apparatus according to the present invention, and the oxide film formed by the conventional film forming method.
Figure 8:
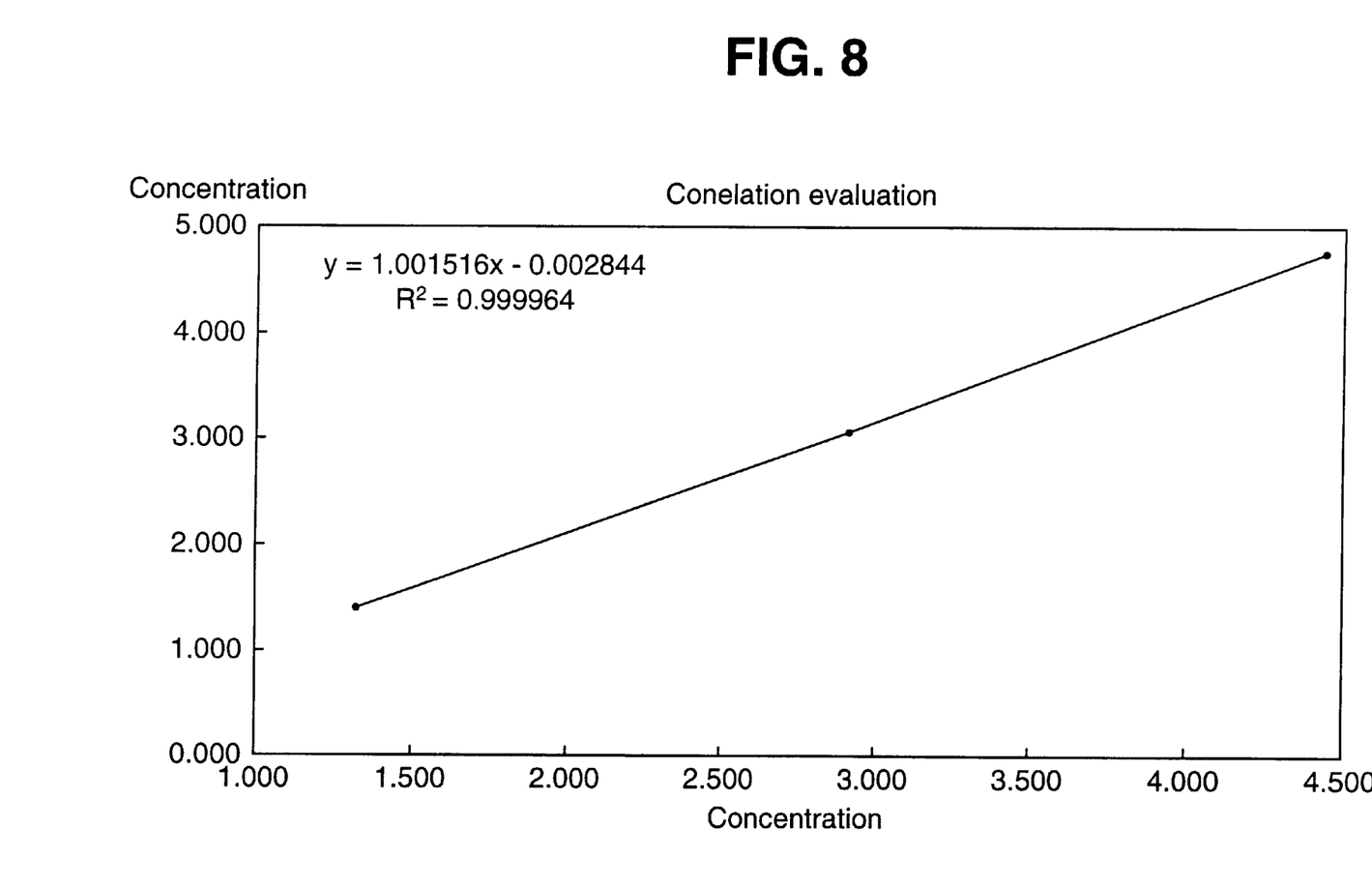
FIG. 8 is a correlation evaluation diagram of measurement values of FIG. 7.

FIG. 7 and FIG. 8 represent correlation evaluations on samples, depending upon concentration. First, FIG. 7 is a measurement result comparison diagram. That is, with respect to three sorts of wafers whose concentration is different from each other, both the concentration of the oxide film formed by the oxide film forming apparatus according to the present invention and the concentration of the oxide film formed by the conventional method are measured three times. FIG. 8 is a correlation evaluation diagram of the measurement values of FIG. 7.

From these drawings, it can be judged that the measurement value of the epitaxial layer impurity concentration based on the oxide film formed by the oxide film forming apparatus according to the present invention can have the useful correlation with the measurement value of the epitaxial layer based on the oxide film formed by the conventional process, and the average values of these measurement values are limited to a very small error, and also the range thereof is limited to a desirable value.

As a consequence, the following confirmation could be made. That is, when the conventional oxide film forming method is replaced by the oxide film forming method according to the present invention, there is no problem in the measurement values.

Figure 9:
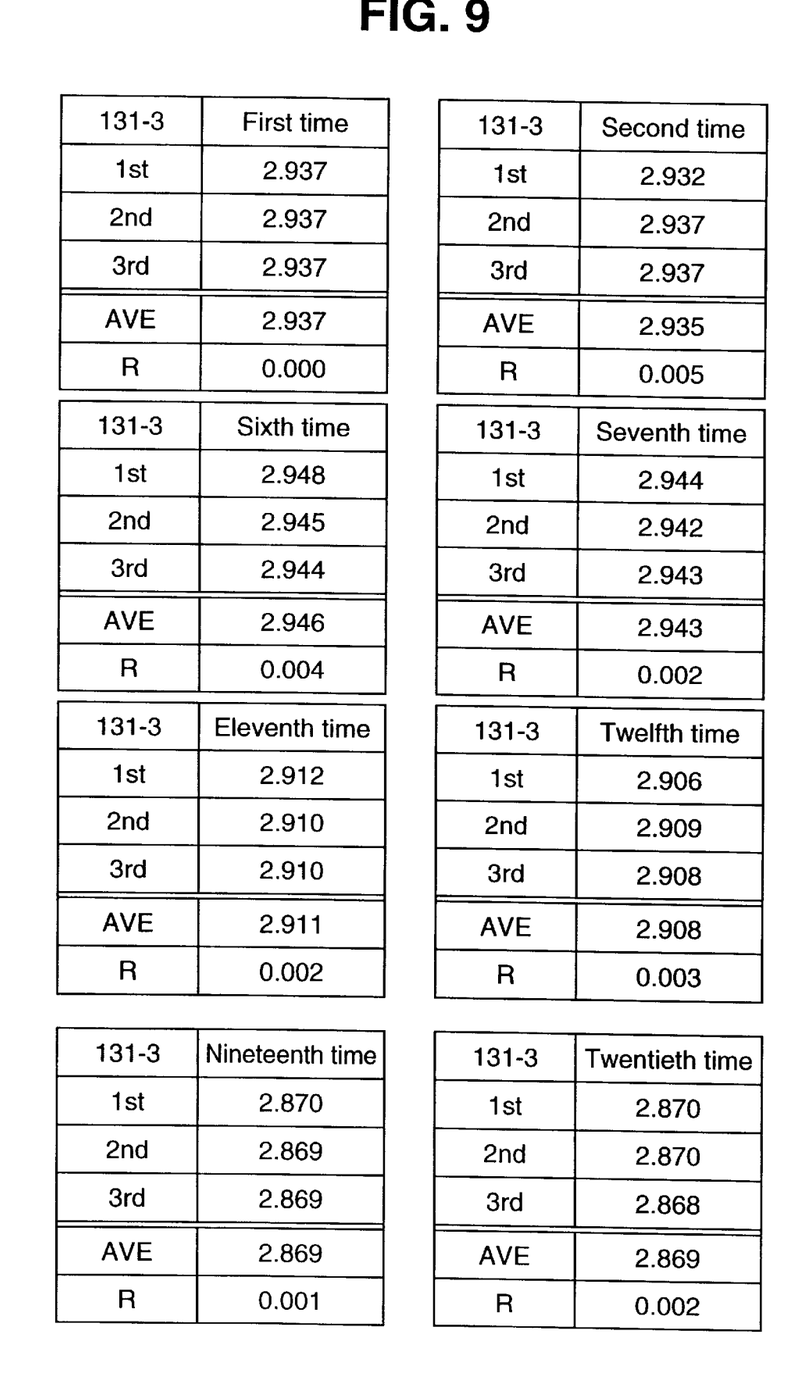
FIG. 9 is a diagram for indicating reproducibility and stability of concentration measurement values of the oxide film formed by the oxide film forming apparatus according to the present invention.
Figure 10:
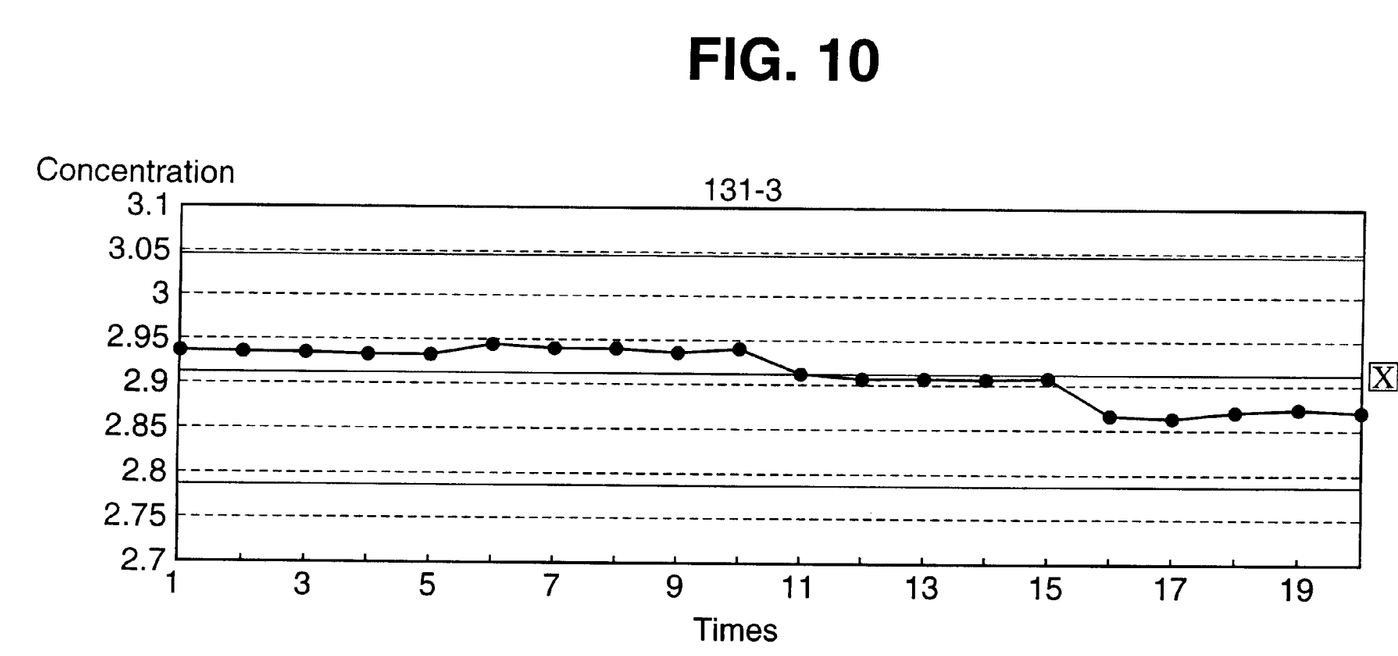
FIG. 10 is a graphic representation for indicating an average value distribution of the measurement values of FIG. 9.
Figure 11:
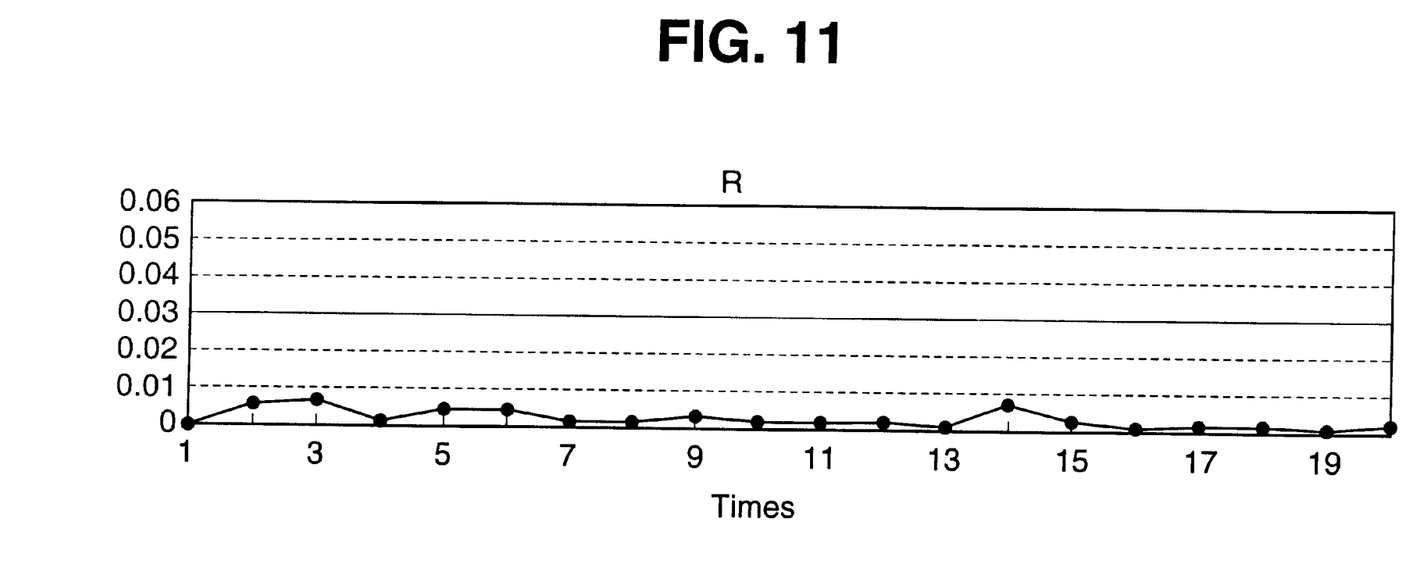
FIG. 11 is a graphic representation for indicating a range distribution of the measurement values of FIG. 9.

Referring now to FIG. 9 to FIG. 11, both reproducibility and stability of the oxide film formed by the oxide film forming apparatus according to the present invention will be explained.

FIG. 9 indicates concentration measurement values as to the same sort (same item number 131-3) of wafers, i.e., a total of 20 samples, in which while the concentration measurements are carried out three times per 1 sample, an average value "X" and a range "R" are obtained. It should be noted that the representations of the sample values are partially omitted.

Furthermore, FIG. 10 is a diagram for indicating an average value distribution of the measurement values shown in FIG. 9, namely a management diagram (X bar management diagram) in which the average values of the concentration X are plotted. FIG. 11 is a diagram for indicating a range distribution of the measurement values of FIG. 9, namely a management diagram (R management diagram) in which the range is plotted.

As apparent from these drawings, i.e., FIG. 9 to FIG. 11, it could be recognized that since the range "R" is present within 0.01, the oxide film formed by the oxide film forming apparatus according to the present invention could realize the supreme reproducibility and the supreme stability.

It should be understood that as previously described, since the oxide film forming speed by the oxide film forming apparatus according to the present invention is fast and moreover the thicker film can be formed, no longer the heating process of the semiconductor substrate is required while the oxide film is formed, although this heating process is carried out in the conventional oxide film forming method. As a consequence, the structure of this oxide film forming apparatus can be made simple.

It should also be noted although the above-described considerations made in this specification have been described by taking account of a fact based upon the argument grounds with a certain theoretical probability, these considerations are not yet theoretically established. Therefore, these considerations may be explained based on other argument grounds, but these other argument grounds never change the structure and the effects of the present invention.

Moreover, the present invention is not limited to the above-described embodiment, but may be modified, changed, or substituted without departing from the technical scope and spirit of the invention.

Since the oxide film forming method of the semiconductor device, as recited in claim 1 of the present invention, is arranged by that oxygen ions are made in contact with a surface of a semiconductor substrate to thereby form a thin oxide film on the surface of the semiconductor substrate, the diffusion resistance related to the oxygen ions is low, and the diffusion of the oxygen ions to the boundary surface can be easily made. Therefore, there is an advantages that the thickness of the formed film can be increased.

The oxide film forming method of the semiconductor device, as recited in claim 2 of the present invention, is arranged by that the oxygen ions are produced by conducting oxygen gas into an electric field generated in response to a DC high voltage having a negative polarity and then by ionizing the conducted oxygen gas. Accordingly, the film forming operation can be easily performed under such a condition that spark discharges such as brush discharge, corona discharge, and arc discharge do not occur. Moreover, the oxygen gas can be ionized while substantially no ozone is produced.

In addition, since the oxide film forming method, as recited in claim 3 of the present invention, is realized such that the above-described the oxygen ions are produced by causing oxygen gas to impinge on an electrode to which a DC high voltage having a negative polarity is applied and then by ionizing the impinging oxygen gas, the oxygen gas can be effectively ionized.

Also, the film forming apparatus of the semiconductor device, as recited in claim 4 of the present invention, is arranged by comprising: a high voltage source for generating a DC high voltage having a negative polarity; one pair of electrodes arranged apart from each other via a space portion, the DC high voltage being applied to one electrode of the one-paired electrodes; a flow path channel formed from an upstream located in a direction perpendicular to the electrodes via the space portion to a downstream, through which oxygen gas may flow; an oxygen source for supplying the oxygen gas from the upstream side of the flow path channel; and a substrate base arranged on the downstream side of the flow path channel, by which a semiconductor substrate can be mounted at a position where this semiconductor substrate is exposed by the oxygen gas which has passed between the one pair of electrodes. Thus, the strong electric field is produced between the electrodes. The oxygen ions are generated when the electrons impinge, which are accelerated in the stage such that the oxygen gas flows through the flow path channel and intersects this strong electric field. As a result, the semiconductor substrate mounted on the substrate base is exposed by the oxygen ions.

The thick oxide film can be formed on the surface of the semiconductor substrate by this ion reaction.

Further, the oxide film forming apparatus of the semiconductor device, as recited in claim 5, is arranged by that at least the one pair of electrodes, the flow path channel, and the substrate base are stored into a chamber. Accordingly, it is possible to suppress that the produced oxygen ions are consumed, namely these oxygen ions disappear, or are coupled with the molecules contained in air. The oxygen ions can be effectively made in contact with the semiconductor substrate, and thus the thick oxide film can be formed within short time.

Also, since the oxide film forming apparatus, as recited in claim 6 of the present invention, is arranged by that the above-described the chamber is made of a closed structure, and pressure in the chamber is increased higher than, or equal to atmospheric pressure, the oxygen pressure within the chamber is increased. Accordingly, the ionization of the oxygen gas can be effectively carried out. Furthermore, the oxygen ion pressure is also increased, so that the diffusion of the oxygen ions into the oxide film can be progressed. Moreover, the ion reaction at the boundary surface can be progressed, and therefore the oxide film having the thick film can be formed within short time.

Also, since the oxide film forming apparatus, as recited in claim 7 of the present invention, is arranged by that the above-described the chamber is made of a closed structure, and pressure in the chamber is decreased lower than, or equal to atmospheric pressure, the molecules contained in air within the chamber is decreased. As a result, there is a little chance of molecule entrainment, and thus the film quality of the oxide film can be improved.

As previously described in detail, in accordance with the oxide film forming method/apparatus of the present invention, the oxide film can be formed under better reproducibility and stable conditions. Moreover, the oxide film can be formed within very short time, as compared with the conventional oxide film forming method/apparatus, resulting in achievements of the industrial effects.

What is claimed is:

1. An oxide film forming apparatus of a semiconductor device, comprising:

a high voltage source for generating a DC high voltage having a negative polarity;

one pair of electrodes arranged apart from each other via a space portion said DC high voltage being applied to one electrode of said one-paired electrodes;

a flow path channel formed from an upstream located in a direction perpendicular to said electrodes via said space portion to a downstream, through which oxygen gas may flow;

an oxygen source for supplying the oxygen gas from the upstream side of said flow path channel wherein the oxygen source supplies the oxygen perpendicularly across the space portion in order to increase oxygen gs ionization;

a substrate base arranged on the downstream side of said flow path channelk by which a semiconductor substrate can be mounted at a position where this semiconductor substrate is exposed by the oxygen gas which has passed between said one pair of eletrodes.

2. An oxide film forming apparatus of a semiconductor device as claimed in claim 1 wherein:

at least said one pair of electrodes, said flow path channel, and said substrate base are stored into a chamber.

3. An oxide film forming apparatus of a semiconductor device as claimed in claim 2 wherein:

said chamber is made of a closed structure, and pressure in said chamber is increased higher than, or equal to atomspheric pressure.

4. An oxide film forming apparatus of a semiconductor device as claimed in claim 2 wherein:

said chamber is made of a closed structure, and pressure in said chamber is decreased lower than, or equal to atmospheric pressure.

5. An oxide film forming apparatus, comprising:

a chamber, a voltage source, the voltage source positioned within the chamber;

a pair of electrodes, the pair of electrodes positioned within the chamber wherein the voltage source applies a voltage to the pair of electrodes to create an electric field;

a flow path channel , the flow path channel associated with the pair of electrodes;

an oxygen source, the oxygen source positioned within the chamber wherein the oxygen source supplies oxygen gas perpendicularly across the pair of electrodes to ionize the oxygen gas wherein the ionized oxygen gas flows through the flow path channel; and a substrate base, the substrate base positioned at a distance from the pair of electrodes to contact the ionized oxygen gas forming a thin oxide film on the substrate base.

6. The oxide film forming apparatus according to claim 5, wherein the voltage is a negative polarity voltage.

7. The oxide film forming apparatus according to claim 6, wherein the voltage is greater than or equal to negative 3 kilavolts and less than or equal to negative fifteen kilavolts.

8. The oxide film forming apparatus according to claim 6, wherein the voltage is greater than or equal to negative eight kilavolts and less than or equal to negative ten kilavolts.

9. The oxide film forming apparatus according to claim 6, wherein the voltage is a greater than or equal to negative five kilavolts and less than or equal to negative twelve kilavolts.

10. The oxide film forming apparatus according to claim 5, wherein a pressure of the chamber is one atmosphere.

11. The oxide film forming apparatus according to claim 5, wherein a pressure of the chamber is more than one atmosphere which increases the oxygen gas ionization.

12. The oxide film forming apparatus according to claim 5, wherein the pressure of the chamber is less than one atmosphere which decreases molecule entrainment over the thin oxide film.

13. The oxide film forming apparatus according to claim 5, wherein the voltage source applies the voltage at a rate to the electric field to ionize the oxygen gas without forming ozone.

14. The oxide film forming apparatus according to claim 5, wherein the pair of electrodes extend into the flow path channel.

15. The oxide film forming apparatus according to claim 5, wherein the pair of electrodes are separated by a space portion.

16. The oxide film forming apparatus according to claim 15, wherein the flow path channel is positioned within the space portion and beyond the space portion.

17. The oxide film forming apparatus according to claim 15, wherein the distance is about equal to the length of the space portion.

18. The oxide film forming apparatus according to claim 15, wherein the distance is about 15 to 20 times longer than a height of the space portion.

19. An oxide film forming apparatus, comprising:
- a chamber,
- a voltage source, the voltage source positioned within the chamber wherein the voltage source supplies voltage that is greater than or equal to negative eight kilavolts and less than or equal to negative ten kilavolts;
- a pair of electrodes, the pair of electrodes positioned within the chamber and separated by a space portion wherein the voltage source applies the voltage to the pair of electrodes to create an electric field;
- a flow path channel, the flow path channel associated with the pair of electrodes;
- an oxygen source, the oxygen source positioned near the pair of electrodes wherein the oxygen source supplies oxygen gas perpendicularly across the pair of electrodes to ionize the oxygen gas wherein the ionized oxygen gas flows through the flow path channel; and
- a substrate base, the substrate base positioned at a distance from the pair of electrodes to contact the ionized oxygen gas forming a thin oxide film having a thickness of at least 15 angstroms on the substrate base, the distance being equal to the length of the space portion.

20. The oxide film forming apparatus according to claim 19, wherein the voltage source applies the voltage at a rate to the electric field to ionize the oxygen gas without forming ozone.

21. The oxide film forming apparatus according to claim 19, wherein a pressure of the chamber is one atmosphere.

22. The oxide film forming apparatus according to claim 19, wherein a pressure of the chamber is more than one atmosphere which increases the oxygen gas ionization.

23. The oxide film forming apparatus according to claim 19, wherein the pressure of the chamber is less than one atmosphere which decreases molecule entrainment over the thin oxide film.

* * * * *